(12) United States Patent
Yoshida

(10) Patent No.: US 6,215,324 B1
(45) Date of Patent: Apr. 10, 2001

(54) DYNAMIC BURN-IN TEST EQUIPMENT

(75) Inventor: Naoki Yoshida, Tokyo (JP)

(73) Assignee: Nippon Scientific Co., Ltd., Tokyo (JP)

( * ) Notice: Subject to any disclaimer, the term of this patent is extended or adjusted under 35 U.S.C. 154(b) by 0 days.

(21) Appl. No.: 09/478,053

(22) Filed: Jan. 5, 2000

(30) Foreign Application Priority Data

Jan. 7, 1999 (JP) .................................. 11-002080

(51) Int. Cl.$^7$ .................................................. G01R 31/02
(52) U.S. Cl. ...................... 324/760; 324/765; 324/158.1; 714/724
(58) Field of Search ................................ 324/760, 158.1, 324/765; 714/728, 724, 730, 733

(56) References Cited

U.S. PATENT DOCUMENTS

| | | | |
|---|---|---|---|
| 4,386,389 | * | 5/1983 | Proebsting ........................ 361/406 |
| 5,233,161 | * | 8/1993 | Farwell et al. ................... 219/209 |
| 5,966,021 | * | 10/1999 | Eliashberg et al. ............... 324/760 |

* cited by examiner

*Primary Examiner*—Safet Metjahic
*Assistant Examiner*—Jimmy Nguyen
(74) *Attorney, Agent, or Firm*—Howard & Howard

(57) ABSTRACT

There is provided a dynamic burn-in test equipment being capable of testing a large number of multi-pin LSI chips in a short test time and at a low cost. The dynamic burn-in test equipment includes at least a thermostatic oven for storing DUTs, a driving unit for applying the input signal to the input terminal of each DUT to apply a predetermined expected value to the output terminal of each DUT, a power supply for applying a predetermined power supply voltage to each DUT through a higher level power supply line and a lower level power supply line (ground line), and a current detector arranged on at least one of the higher level power supply line and the lower level power supply line (ground line). The dynamic burn-in test equipment monitors a power supply current to detect a failure.

10 Claims, 10 Drawing Sheets

Prior Art

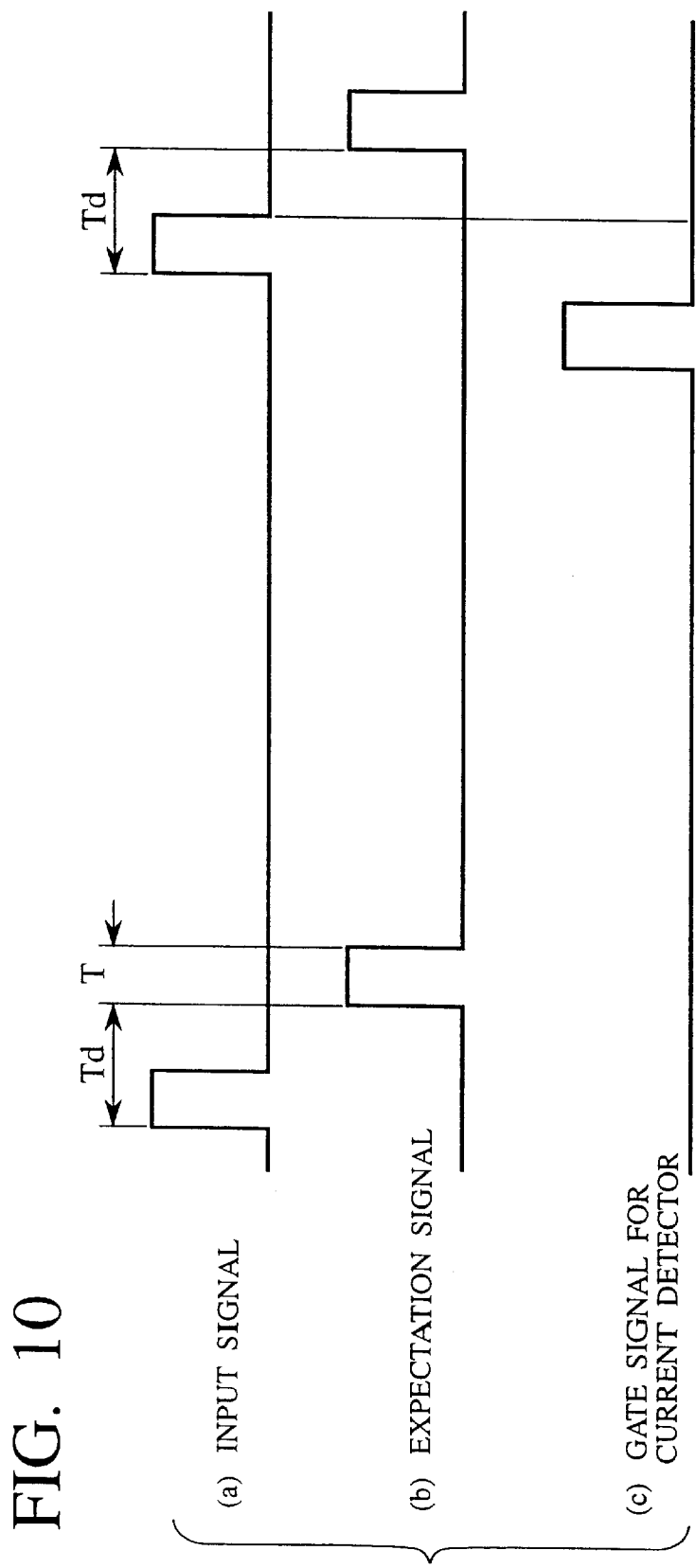

DYNAMIC BURN-IN TEST EQUIPMENT

CROSS REFERENCE TO RELATED APPLICATIONS

The subject application is related to subject matter disclosed in the Japanese Patent Application No. Hei 11-2080 filed in Jan. 7, 1999 in Japan, to which the subject application claims priority under the Paris Convention and which is incorporated by reference herein.

BACKGROUND OF THE INVENTION

1. Field of the Invention

The present invention relates to a reliability test equipment and a failure rate test equipment. More particularly, the present invention relates to a dynamic burn-in test equipment for testing large scale integration chips (LSI chips) sealed in packages each having a large number of I/O pins. Here, the LSI chips may include very large scale integration chips (VLSI chips), ultra large scale integration chips (ULSI chips) or gigascale integration chips (GSI chips).

2. Description of the Related Art

In recent years, the operation speeds, the memory capacities, and the numbers of bits of semiconductor devices are considerably increasing. As high-speed semiconductor devices, devices having operation frequency higher than 500 MHz, e.g., reduced instruction set computer (RISC) like microprocessor units (MPUs) have been developed. The number of pins of a package is also rapidly increasing. In this manner, the development of the semiconductor devices advances, new functions are successively added to the semiconductor devices. Accordingly, a testing technique such as a reliability test must keep in step with the development of devices. However, the development speed of semiconductor devices acceleratively increases, miscellaneous new functions to be added to the semiconductor devices become varied. Nowadays, the development speed of the testing technique is gradually behind the development speed of the semiconductor device. In particular, it has been very difficult to perform a reliability test for multi-pin LSI chips within a short test time and at a low cost.

In order to calculate failure rates of LSI chips as correct as possible, a large number of products must be tested for a very long test period. If the values of failure rates calculated as results of the test are equal to each other, the statistical "validities" of the failure rates are considerably different from each other depending on the numbers of tested products.

In general, the failure rate versus age (or "time in use") curve follows the well-known shape of the of the "bathtub curve" shown in FIG. 1. The failures are typically grouped into one of three categories: infant mortality, useful life, and wearout failures. The infant mortality failures, also called "early failures" or "patent failures" occur during early product life cycle, and by definition, the failure rate decreases with age. After the infant mortality failures are culled out, the component settle into a long period of useful life failure, called "over stress failures" or "intrinsic failures" which are caused by high-level stress outside those expected in normal usage. Finally, wearout failures begin to be significant as normal wear out mechanisms start to take their toll on components that are manufactured within acceptable specifications. Since the wearout failures occur considerably later than rated lifetime of semiconductor devices in general, the failure rate versus age curves in the infant mortality and the useful life stages are important.

Therefore, in order to obtain meaningful qualification test data, the bathtub curve shown in FIG. 1 must be plotted so as to identify one of three failure mechanisms, by focusing on the failure rate versus age curve, calculated by the result of the test.

In general, "burn-in testing", or component testing where infant mortality failures are screened out by testing at elevated voltages and temperatures for a specified length of time, serving as an accelerated environment testing, is performed to plot in a short test period the failure rate versus age curves as shown in FIG. 1. On the assumption that the chemical reaction rate associated with the failure mechanism is expressed by an exponential function and has a positive temperature coefficient according to Arrhenius' equation, the test temperature is elevated to make the device failure conspicuous. Acceleration coefficient B of a failure rate is generally given by:

$$B = \exp\{-(\Delta E/k) \cdot (1/T_{jH} 1/T_{jF})\} \quad (1)$$

where $\Delta E$: activation energy of a failure [eV], k: Boltzmann's constant=$8.617 \times 10^{-5}$ [eV/K], $T_{jH}$: p-n junction temperature [K] of an LSI chip at the elevated temperature in the accelerated environment testing, and $T_{jF}$: p-n junction temperature [K] of the LSI chip under normal and actual usage condition.

A perfect product must have an endless lifetime. More specifically, a limited lifetime is caused by the presence of any defect. If the defect is accelerated and increased by the elevated temperature under the test condition, the product is recognized as a defective. We can understand that the burn-in testing is conducted on the assumption that the long lifetimes of products that are able to pass the accelerated environment testing can be secured.

Since it is desirable to complete a reliability evaluation testing in a short test time, the reliability evaluation testing should be performed at an elevated temperature which is as high as possible. However, an annealing temperature is limited to a predetermined value because good products must not be damaged. According to such a consideration, the burn-in testing is performed at a limited elevated temperature at which the validity of acceleration can be recognized.

The characteristic feature of the burn-in testing is that the semiconductor device is tested at the elevated temperature, while supplying predetermined supply voltages. As a typical failure mechanism of LSI chips, an imperfect metallization or connection is known. Since the resistance of the interconnection is desired to be low, unexpected heat is generated at the interconnection where the resistance of the interconnection is high due to, for example, flaw, void, electromigration, corrosion, or non-ohmic contact. This means that a large acceleration coefficient is applied to only the weak portion.

When signals are given to an LSI, or a device under test (DUT) at random, all the internal circuits of the DUT cannot be operated. Therefore, a predetermined test pattern adjusted for an LSI test equipment is used for a reliability evaluation testing of the LSI chip. More specifically, in the burn-in testing, a test pattern generator (signal generator) having the same function as that of the LSI test equipment is required. Since the internal circuits of the LSI chip are operated by miscellaneous signals generated by the signal generator, such a test method for the LSI chip is called "dynamic burn-in testing". On the other hand, a burn-in testing in which any signal in the internal circuits of the LSI chip does not change at all under a high-temperature accelerated environment, while power supply lines are only connected to the LSI chip, is called "static burn-in testing". And, in this connection, a high-temperature accelerated environment testing in which even the power supply lines are not connected to the LSI chip is called a "high-temperature shelf life testing". Of the three test methodologies, the static burn-in testing and the high-temperature shelf life testing are mainly used at present. The static burn-in testing generally requires 8 to 16 hours. However, since the dynamic burn-in testing can drive all the internal circuits in the LSI chip, a local temperature in the LSI chip increases, and the dynamic burn-in testing is expected to be able to perform a testing in a shorter test period than that of the static burn-in testing. However, in a conventional static burn-in technique, the static burn-in testing requires very long test time. That is, the conventional static burn-in technique can be performed only when the numbers of pins of LSI chip serving as DUT are very small, and the number of DUTs must be small. In addition, the burn-in test equipment is expensive, and a running cost is high. For this reason, the dynamic burn-in testing is actually used in only a very limited situation.

FIG. 2 shows the outline of the conventional general dynamic burn-in test equipment used in the burn-in testing described above. As shown in FIG. 2, in the conventional dynamic burn-in test equipment, a large number of DUT boards 21, 22, 23, 24, . . . are stored in a thermostatic oven (or a thermostatic chamber) 1, and proper signals are supplied to the input pins of the DUT boards 21, 22, 23, 24, . . . by the test pattern generator 2 to monitor signals from output pins, thereby deciding the test results.

FIG. 3 is a block diagram for explaining a result decision circuit of the conventional general burn-in test equipment. A "high (H)" or "low (L)" value stored in a pattern memory 61 is transferred to an input terminal (input pin) of the DUT 21 through a driver 51, information appeared at an output terminal (output pin) of the DUT 21 is compared with an expected value by a comparator 53. An "H" or "L" expected value is stored in an expectation memory 64 in advance. The behavior or the result of the compared output terminal is stored in a result memory 65. In FIG. 3, although only one input pin and one output pin of one DUT 21 are shown, input/output terminals constituted by 100 to 500 pins are actually arranged on the DUT 21. A plurality of DUTs are stored in the thermostatic oven 1, and a plurality of result decisions are simultaneously required. All the input terminals can be parallel connected by a proper architecture in which series resistors are inserted into the terminals of the respective DUTs. However, values from the output terminals of the plurality of DUTs must be compared with the respective expected values by an independent comparator, and must be independently extracted.

FIG. 4 is a block diagram showing the conventional dynamic burn-in test equipment in which DUTs and pins are very much simplified. More specifically, FIG. 4 shows the connection topology between the three DUTs 21, 22, and 23 each having five input terminals IN1, IN2, . . . , IN5 and five output terminals OUT1, OUT2, . . . , OUT5 and the test pattern generator 2.

In a general burn-in test equipment, since a large number of DUTs 21, 22, and 23 are simultaneously tested, all the input terminals of the DUTs 21, 22, and 23 are electrically connected in parallel, and an equal signal is supplied from the test pattern generator 2 to the input terminals of the DUTs 21, 22, and 23. The output terminals of the DUTs 21, 22, and 23 need not be monitored for the purpose of the conventional burn-in testing. Then, the output terminals of the DUTs 21, 22, and 23 may be opened or subjected to a specific terminal connection topology. However, when a large number of defective products are produced, the conditions of the DUTs 21, 22, and 23 must be recognized during the testing by using the output terminals OUT1, OUT2, . . . , OUT5; OUT6, OUT7, . . . , OUT10; OUT11, OUT12, . . . , OUT15. More specifically, since signals of the output terminals must be extracted from the DUTs, the number of cables (N) which are running into or from the thermostatic oven satisfies the following equation:

$$N=P+n \cdot Q+2 \qquad (2)$$

where P is the number of input pins of each DUT, Q is the number of output pins of each DUT, and n is the number of DUTs. The third term of the right side of Equation (2) is the number of power supply lines.

For example, in Equation (2) described above, the number of input pins P is set to be 100, the number of output pins Q is set to be 100, and the number of DUTs n in the board is set to be 30. In this case, a large value, i.e., N=3100 is obtained. In general, the number of output pins Q is large, the values P and Q may 200 or more. Therefore, in the conventional method, when the number of output pins becomes large, the value N becomes a value which cannot be realized. More specifically, only if the number of DUTs should be one to several, data represented by the bathtub curve shown in FIG. 1 could be obtained. Namely, the failure rate of a large number of DUTs cannot be actually measured because the equipment configuration becomes very complex and because a test time becomes extremely long. At present, since the number of output pins of an LSI chip tends to increase, the following problem is posed. That is, it is becoming more and more difficult or impossible that a failure rate of LSI chips is measured in a short test time and with a low cost.

As described above, in the conventional burn-in test equipment, a dynamic burn-in testing for monitoring all the outputs appeared at output terminals of DUTs to investigate all of the operations in an LSI chip cannot be realized.

SUMMARY OF THE INVENTION

The present invention has been made in consideration of the above problem.

And a object of the present invention is to provide a dynamic burn-in test equipment being capable of evaluating the reliabilities of a large number of DUTs in a short test time.

More specifically, another object of the present invention is to provide a dynamic burn-in test equipment being capable of substantially monitoring all signals in an LSI chip, having a large number of input/output pins, e.g., 100 or more input/output pins, at a low running cost to measure a failure rate of the LSI chip.

Still another object of the present invention is to provide a dynamic burn-in test equipment being capable of measuring a large number of multi-pin LSI chips in a short test time and at a low cost to easily obtain a bathtub curve.

It is still another object of the present invention to provide a dynamic burn-in test equipment in which, even if a DUT have a large number of pins, the number of cables penetrating through the wall of the thermostatic oven can be considerably reduced so as to simplify an equipment configuration, so that to reduce the cost of the dynamic burn-in test equipment.

In order to achieve the above objects, a feature of present invention inheres in a dynamic burn-in test equipment for detecting an abnormal operation of internal circuits in each of n DUT, the each DUT has P input terminals and Q output terminals. Namely the dynamic burn-in test equipment of the present invention comprises a thermostatic oven configured such that it can store n DUTs; a driving unit configured such that it can apply P input signals to P input terminals in each of n DUTs and Q expected values to Q output terminals in each of n DUTs; a power supply configured such that it can provide a power supply voltage to n DUTs through n higher level power supply lines and n lower level power supply lines; and current detectors arranged on at least one of the higher and lower level power supply lines.

According to the feature of the present invention, P input signals and Q expected value signals can be given to the P input terminals and the Q output terminals of n DUTs in parallel. When abnormality occurs in the internal circuit of the DUT, a difference between the output from the internal circuit and the expected value supplied from driving unit is generated. And the difference causes current flows in the driving unit and the signal line of the DUT. Then, a current flowing between the driving unit and the signal line of the DUT must appears as a change of a current in the higher or lower level power supply line. Therefore, when the currents flowing in the higher and lower level power supply line are monitored, it can be determined whether the DUT is normal or abnormal state. For this reason, when the number n of DUTs and the number P of input terminals, and number Q of output terminals are large, the number of cables N running into or from a thermostatic oven does not significantly increase, and the configuration of a burn-in test equipment becomes simple. Therefore, the cost of the dynamic burn-in test equipment of the present invention decreases. Further, according to the present invention, since a large number n of multi-pin DUTs can be simultaneously tested, a running cost decreases. Furthermore, according to the present invention, since bathtub curves of a large number n of multi-pin DUTs can be measured, highly reliable failure rate can be measured.

BRIEF DESCRIPTION OF THE DRAWINGS

FIG. 10 is a timing chart showing the operation of the gate circuit in FIG. 9.

Figure 1:
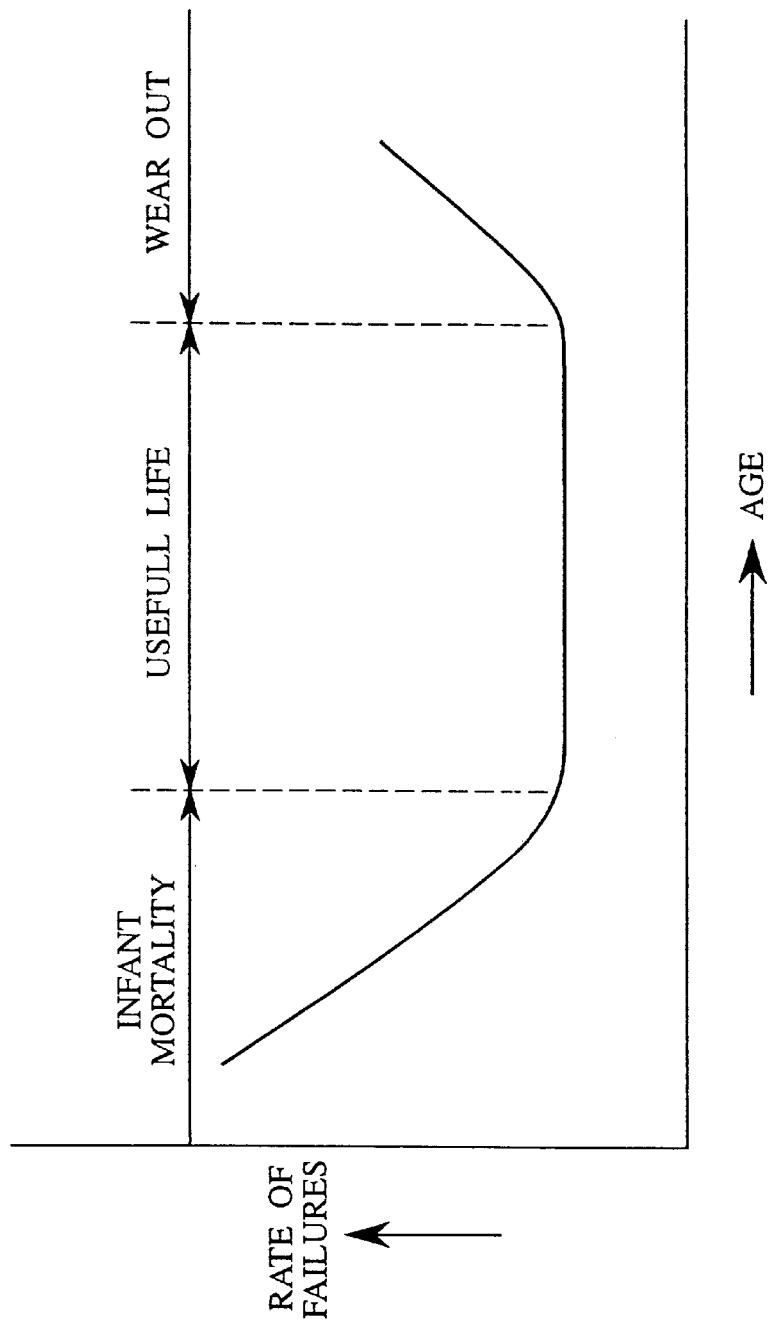
FIG. 1 is a chart for explaining time transition of a failure rate.

DETAILED DESCRIPTION OF THE PREFERRED EMBODIMENT (Basic Concept of the Present Invention)

At present, 95% of IC chips on markets have CMOS structures. If a DUT is an LSI chip based on a CMOS configuration having a p-channel MOSFET and an n-channel MOSFET, at a specific timing, only one of the p-channel MOSFET and the n-channel MOSFET becomes conductive state. For this reason, current detectors of the present invention are preferably inserted into both a higher level power supply line side and a lower level power supply line (or ground line) side.

A signal appearing at an output terminal of a normal LSI chip is uniquely determined while a predetermined signal (test vector) for evaluation for performing a function testing is applied to an input terminal. More specifically, the value appearing at the output terminal of a normal DUT (LSI chip) can be uniquely determined by the input test vector, and can be signified. In the present invention, the "signified value", or the expected value is supplied to the corresponding output terminal of the LSI chip serves as a sample. If the function of the LSI chip is normal, a signal level of the "signified value" supplied to the output terminal of the LSI chip is equal to a signal level of the output from the internal circuit of the LSI chip. For this reason, the both voltage levels are in an equilibrium state, and a current does not flow. In a normal CMOS, a current does not flows at all in a static state, and a DC current called a "crowbar current" or "short-circuit transient current" and a capacitive charge/discharge current flow only when the logic state is inverted. Therefore, when the internal circuit of the LSI chip has a CMOS structure, and a predetermined expected value is applied to the output terminal of the LSI chip, no DC current must substantially flow in the LSI chip serving as a sample.

However, when abnormality occurs in the internal circuit of the LSI chip, a difference between the output from the internal circuit and the expected value supplied from driving unit is generated. And the difference causes current flows in the test pattern generator (driving unit) and the signal line of the LSI chip, depending on the incoincidence of the logic. A current flowing between the driving unit and the signal line of the LSI chip must appears as a change of a current in a higher level power supply line or a lower level power supply line (ground line) connected to the LSI chip. Therefore, when the currents flowing in the higher level power supply lines and lower level power supply line (ground line) connected to the LSI chip are monitored, it can be determined whether a multi-pin LSI chip serving as a DUT is normal or abnormal state. More specifically, two power supply lines are added to one DUT, so that a functional abnormality can be monitored on real time by the power supply lines. For this reason, the number of cables N running into or from the thermostatic oven of the burn-in test equipment according to the present invention is expressed by:

$$N=P+Q+2 \cdot n \tag{3}$$

In the present invention, since only the expected value of the LSI chip may be supplied to the output terminal, common signals can be applied to the output terminals of all the DUTs in parallel through a predetermined resistor. For this reason, even the number of DUTs n increases, the number of signal lines connected from the test pattern generator (driving unit) to the output terminals of the DUTs may be equal to the number of output pins Q.

For example, in Equation (2) described above, the number of input pins P is set to be 100, the number of output pins Q is set to be 100, and the number of DUTs n is set to be 30. In this case, according to the prior art, N=3100 is obtained. However, according to the present invention, as is apparent from Equation (3), a one order smaller value, i.e., N=260 can be obtained.

In this manner, in the prior art, the value N is 3100 which cannot be practically realized. However, in the dynamic burn-in testing of the present invention for monitoring the difference between the output from the internal circuit and the expected value supplied from external circuit, a practical and reasonable number N can be obtained.

The current detector according to the present invention is preferably designed to measure a current in an interval between a timing at which transition of the state of the internal circuit of the DUT occurs and a timing at which the next transition of the state of the internal circuit occurs. The current detector is preferably designed to measure voltage drop between both the ends of a current detecting resistor inserted into the higher level power supply line or a lower level power supply line (ground line). In addition, more specifically, the current detector is preferably designed to cause a differential amplifier to amplify the voltage drop between both the ends of the current detecting resistor and to compare an output from the differential amplifier with a predetermined threshold voltage.

(Preferred Embodiment)

A preferred embodiment of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of instrument, it will be appreciated that the various drawings are not drawn to scale from one figure to another nor inside a given figure. In the following description, numerous specific details are set fourth such as specific circuit, etc. to provide a through understanding of the present invention. However, it will be obvious to those skilled in the art that the present invention may be practiced without such specific details.

Figure 5:
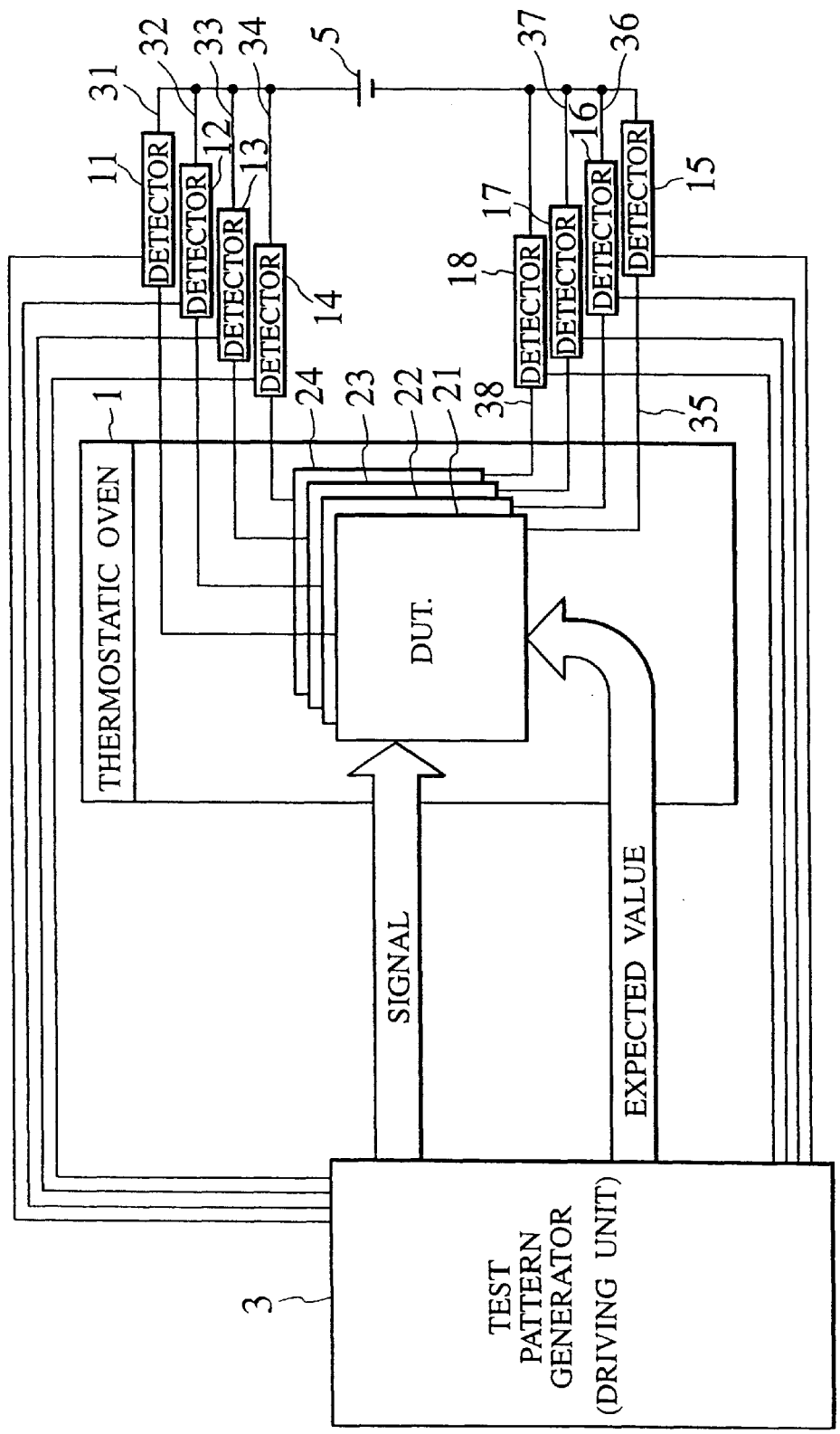
FIG. 5 is a diagram showing the outline of a dynamic burn-in test equipment according to an embodiment of the present invention.

FIG. 5 is a diagram showing the basic configuration of the dynamic burn-in test equipment according to the embodiment of the present invention. More specifically, as shown in FIG. 5, the dynamic burn-in test equipment according to the present invention comprises: a thermostatic oven 1 for storing DUTs 21, 22, . . . , 24 such as a plurality of LSI chips; a test pattern generator (driving unit) 3 for applying input signals for operating the internal circuits of the DUTs 21, 22, . . . , 24 to the input terminals of the DUTs 21, 22, . . . , 24 to apply expected values of outputs from the internal circuits of the DUTs 21, 22, . . . , 24 to the output terminals of the DUTs 21, 22, . . . , 24; a power supply 5 for applying a predetermined power supply voltage to the DUTs 21, 22, . . . , 24 through the higher level power supply lines 31,32, . . . , 34 and the lower level power supply line (ground line)s 35, 36, . . . , 38; and current detectors 11, 12, . . . , 18 respective arranged on the higher level power supply lines 31, 32, . . . , 34 and the lower level power supply lines (ground lines) 35, 36, . . . , 38.

In this case, the plurality of DUTs 21, 22, . . . , 24 are actually mounted on a DUT board, and a plurality of DUT boards are stored in the thermostatic oven. However, in FIG. 5, the DUT boards are omitted to avoid cluttering up the drawings. The thermostatic oven may be set at a predetermined elevated temperature of e.g., 125° C. to 140° C.

As has been described above, in the conventional dynamic burn-in testing, proper signals are given to the DUT board by the test pattern generator (driving unit), and all of the signals from the output terminals (output pins) are respectively measured one by one, to decide the test results. For this reason, when Q represents the number of pins, and when the number of DUTs is represented by n, the values at the output terminals are compared with expected values by using wires, the number of which is represented by n·Q. However, in the present invention, test results need not be decided individually such that values at the output terminals are respectively compared with the corresponding expected values. That is only Q wires, the number of which is equal to the number of output pins, are connected to the output terminals of the DUTs in parallel. In addition, since the number of input terminals (input pins) of the DUTs is represented by P, input signals can be applied to the DUTs in parallel with P wires. However, the higher level power supply lines 31, 32, . . . , 34 and the lower level power supply lines (ground lines)35, 36, . . . , 38 must be independently extracted from each of the DUTs. This is because any difference between the outputs from the internal circuits and the expected values causes respective changes of the currents in the respective higher level power supply line 31, 32, . . . , 34 or the respective lower level power supply lines (ground lines) 35, 36, . . . , 38. If the number of DUTs is represented by n, the total number of power supply lines is represented by 2·n. Then, 2·n power supply lines are running in to or from the thermostatic oven 1. Therefore, as a whole, N cables, the number of which is represented by Equation (3), are running into or from the thermostatic oven 1.

Figure 2:
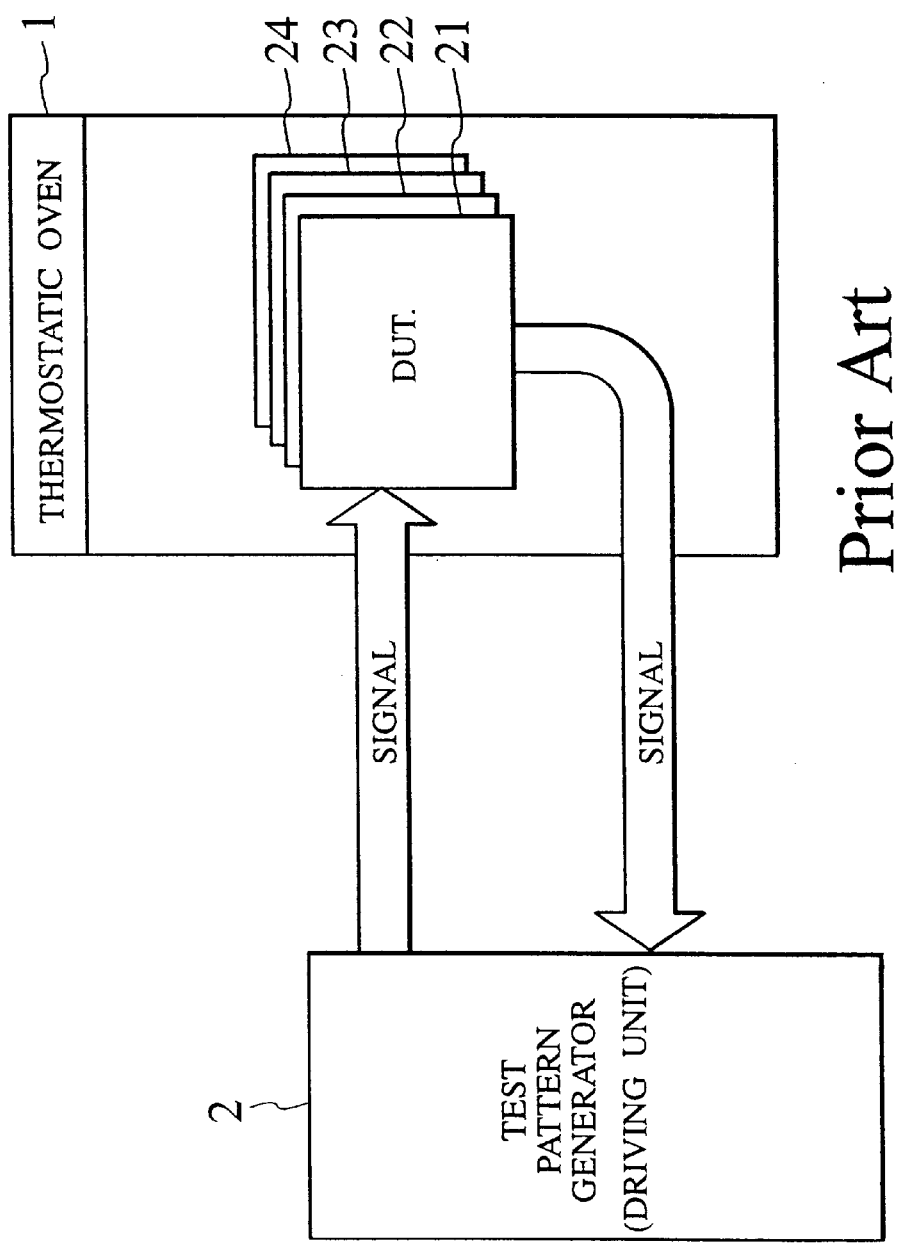
FIG. 2 is a diagram showing conventional dynamic burn-in test equipment.
Figure 3:
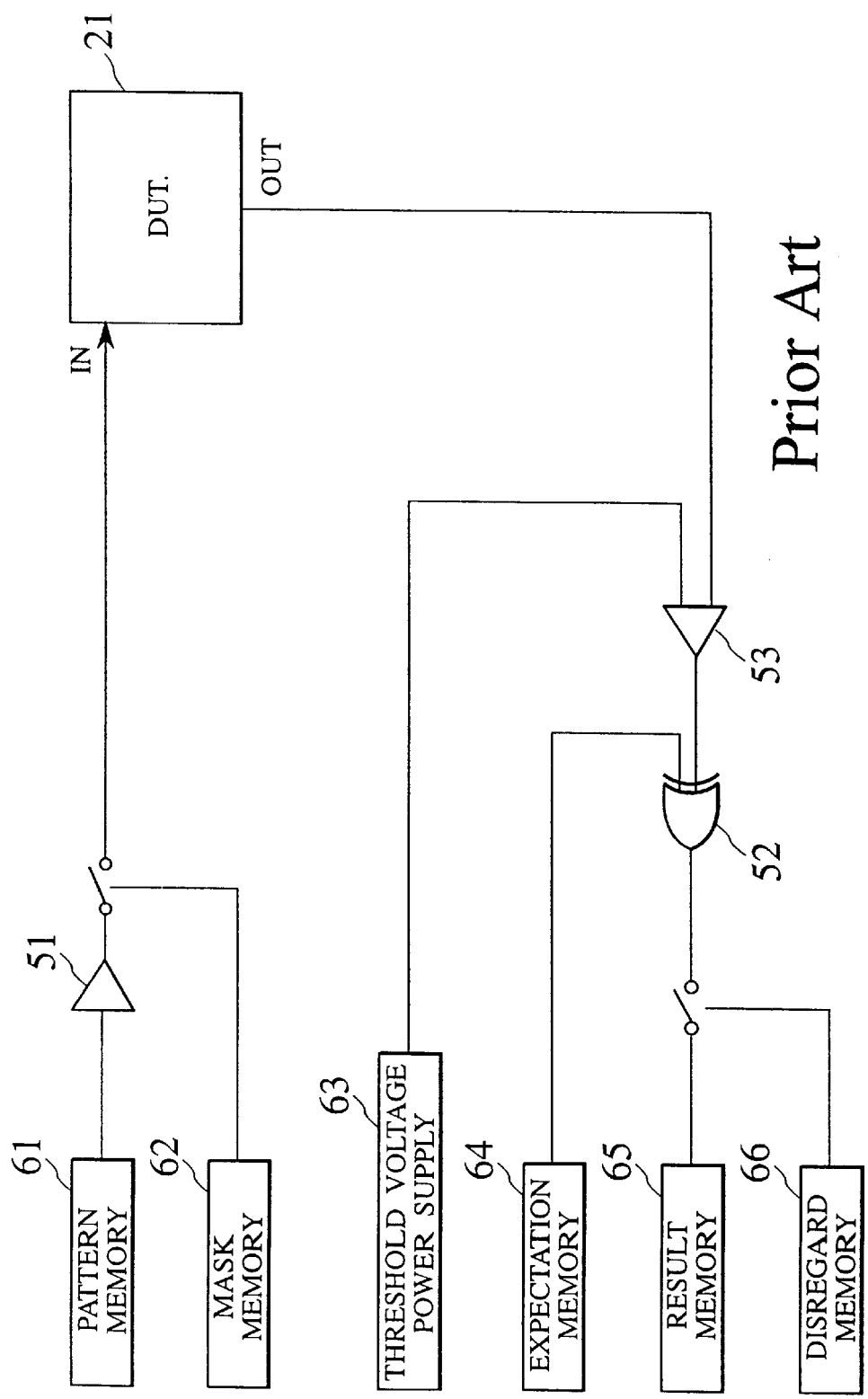
FIG. 3 is a block diagram for explaining a result decision circuit of the conventional dynamic burn-in test equipment.
Figure 4:
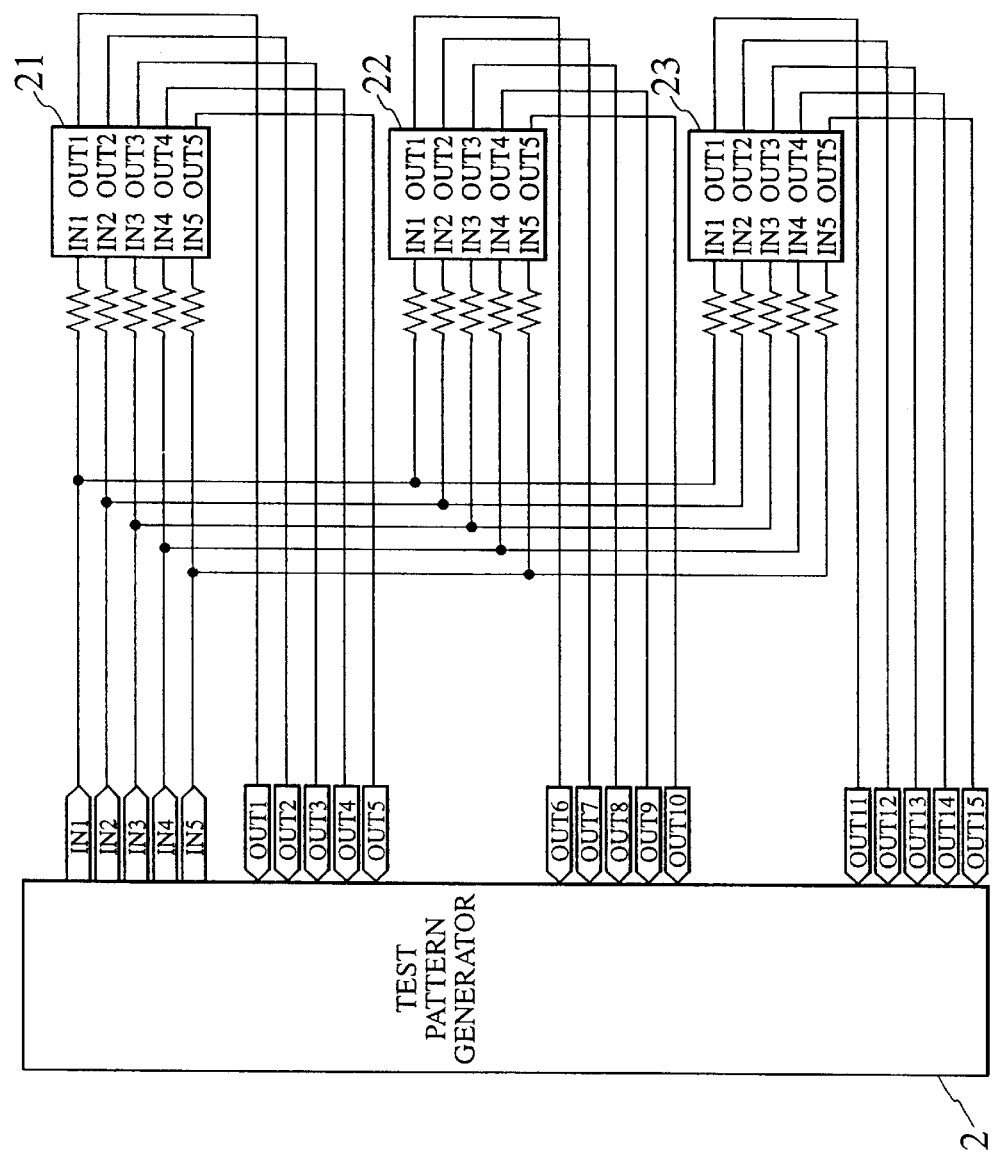
FIG. 4 is a diagram showing the connection relationship between signal wires in the conventional dynamic burn-in test equipment.
Figure 6:
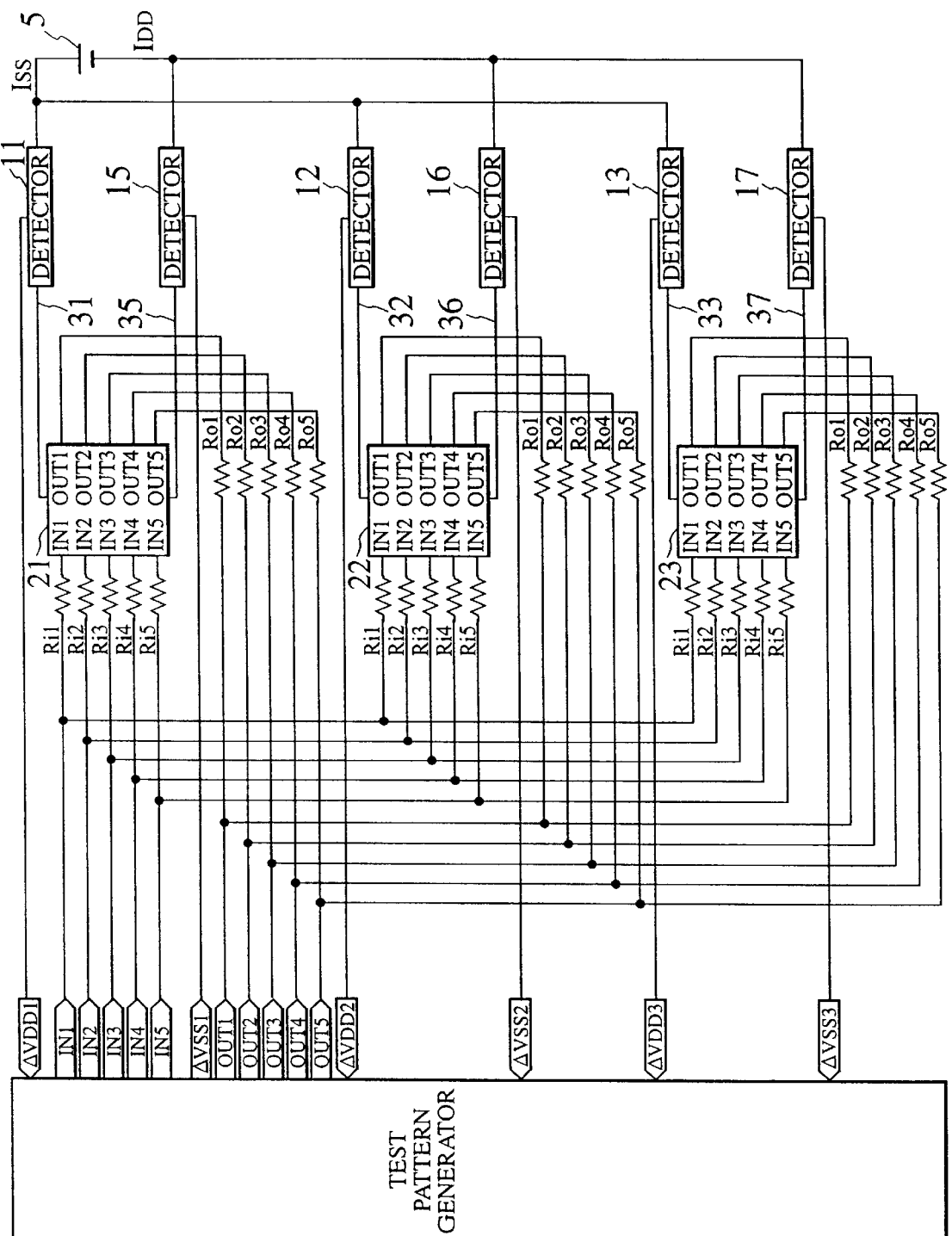
FIG. 6 is a block diagram showing the signal wires in FIG. 1 in detail.

FIG. 6 is a diagram concretely showing signal lines connected to input pins IN1, IN2, . . . , IN5 and output pins OUT1, OUT2, . . . , OUT5. In fact, the number of input pins P and the number of output pins Q are 50 to 200 or more. However, since all the input pins and the output pins are illustrated to disadvantageously make the drawing complex, in FIG. 6, only each five lines are illustrated. In addition, in FIG. 6, although only three DUTs are illustrated, the number n of DUTs may be 30 to 500 or more as a matter of course. As shown in FIG. 2, the input pins IN1, IN2, . . . , IN5 of all the DUTs are respectively connected to the corresponding input pins IN1, IN2, . . . , IN5 of the test pattern generator (driving unit) in parallel through predetermined resistors $R_{i1}, R_{i2}, \ldots, R_{i5}$, respectively. In addition, since predetermined expected values may be applied to the corresponding output pins OUT1, OUT2, . . . , OUT5 of the DUTs respectively, the output pins OUT1, OUT2, . . . , OUT5 can be respectively connected to the corresponding output pins OUT1, OUT2, . . . , OUT5 of the test pattern generator (driving unit) through resistors $R_{O1}, R_{O2}, \ldots, R_{O5}$, respectively. Therefore, the number of cables that are running into or from the thermostatic oven does not increase even if the number n of DUTs increases.

Figure 7:
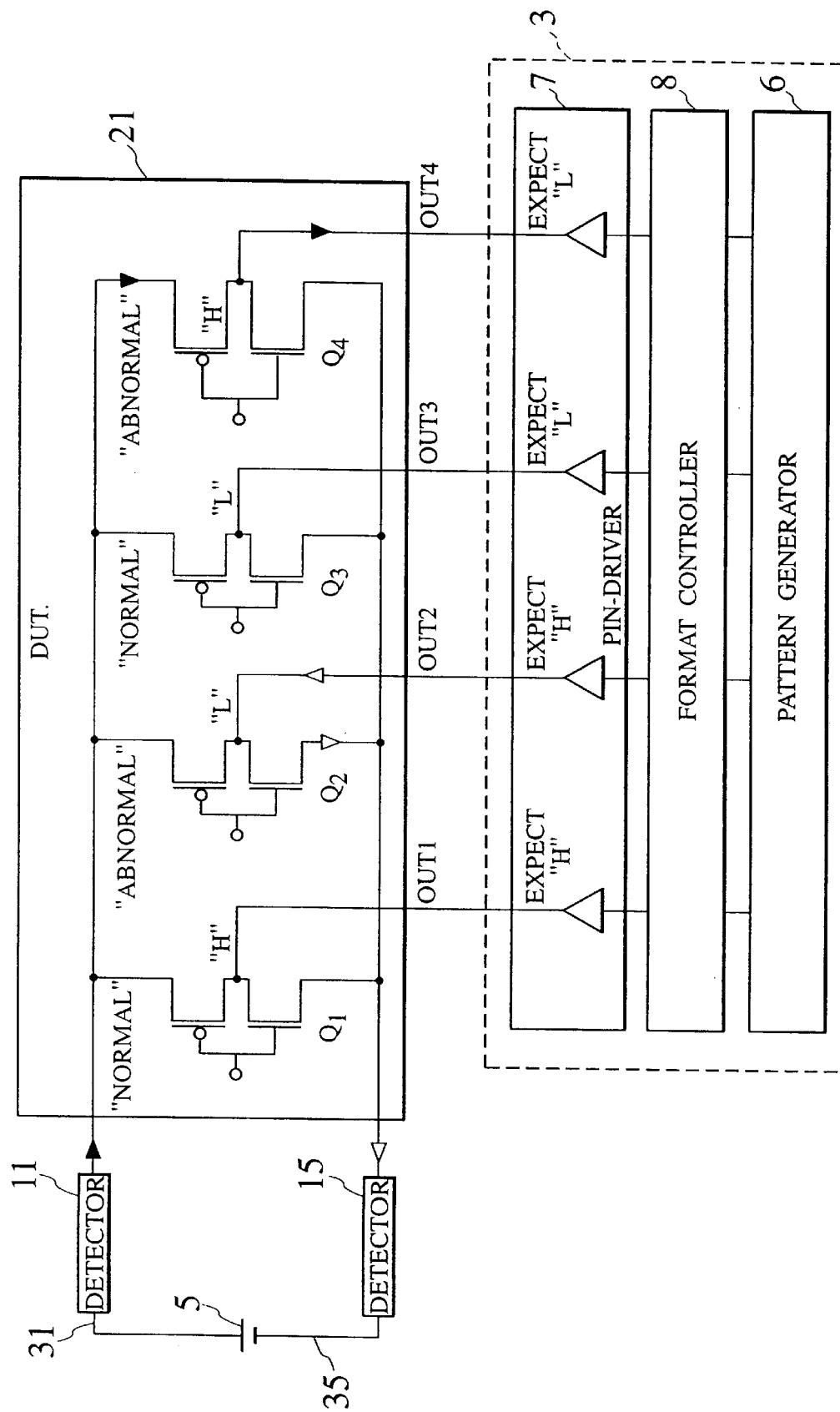
FIG. 7 is a diagram showing the principle of a failure detection method according to the present invention.

FIG. 7 is a diagram showing the principle of a failure detection method in the dynamic burn-in test equipment according to the embodiment of the present invention. In FIG. 7, four output-stage CMOS inverters $Q_1, Q_2, \ldots, Q_4$ arranged in the DUT 21 are typically shown. As a matter of course, since the number of output-stage CMOS inverters is equal to the number of output pins, the number of output-stage CMOS inverters are actually 50 to 200 or more. A predetermined power supply voltage (e.g., 5 V, 3.2 V, 1.5 V, or the like) is applied to the CMOS inverters $Q_1, Q_2, \ldots, Q_4$ through the higher level power supply line 31 and the lower level power supply line (ground line) 35. An expected value pattern generated by a pattern generator 6 is shaped in waveform by a format controller 8 so as to form predetermined expected values. And the predetermined expected values are applied to the output terminals OUT1, OUT2, ..., OUT4 through a pin driver 7. In the pin driver 7, a signal from the pattern generator 6 is set at a predetermined signal level. In FIG. 7, the expected values of the output pins OUT1, OUT2, OUT3, and OUT4 are set at "H", "H", "L", and "L" levels, respectively. In a normal LSI chip, when a predetermined input signal is applied to the input terminal of the DUT 21, a signal from the output terminal OUT1, OUT2, ..., OUT4 of the DUT 21 is uniquely determined. That is, an "H" or "L" signal level applied to the output terminal should be equal to the "H" or "L" signal level of each output-stage CMOS inverter. When the internal circuit of the LSI chip serving as a DUT normally operates, an output signal from the internal circuit of the DUT 21 and a signal given from the pin driver 7 are in an equilibrium state at the output terminal OUT1, OUT2, ..., OUT4, and a current does not flow.

However, as shown in FIG. 7, when the CMOS inverters $Q_2$ and $Q_4$ abnormally operate to output "L"- and "H"-level signals, a current flows in the output terminals OUT2 and OUT4 depending on the level difference. In the CMOS inverter $Q_2$ outputting "L"-level signal, since an n-channel MOSFET is in an ON state, a current flows in the higher level power supply line 31. On the contrary, in the CMOS inverter $Q_4$ outputting "H"-level signal, since an p-channel MOSFET is in an ON state, a current flows in the lower level power supply line (ground line) 35. More specifically, if an abnormality occurs in the internal circuit of the DUT 21, an abnormal current must flow in the higher level power supply line 31 or the lower level power supply line (ground line) 35. Therefore, an abnormality of the internal circuit of the DUT can be detected by the current detector 11 arranged on the higher level power supply line 31 and the current detector 15 arranged on the lower level power supply line (ground line) 35.

Figure 8:
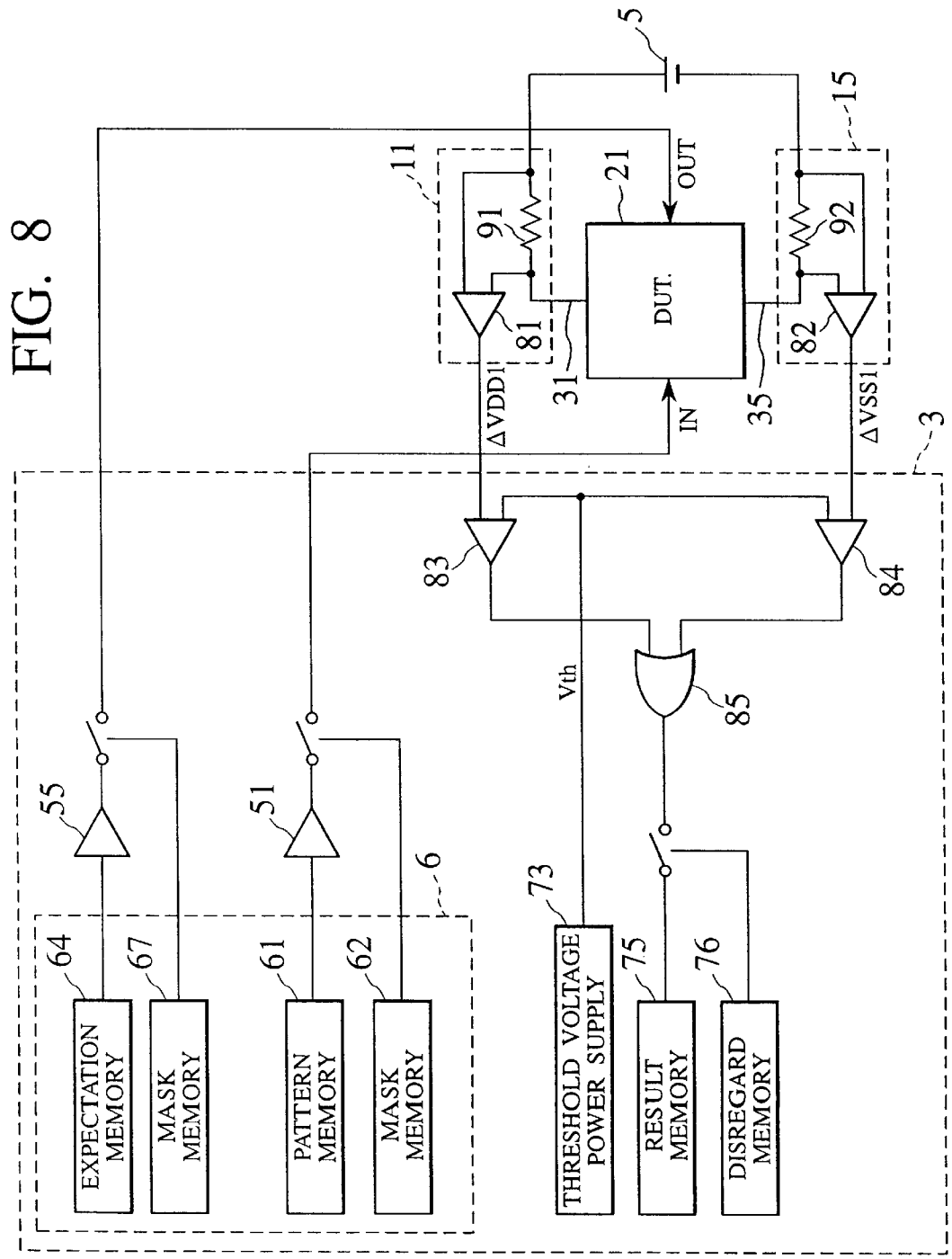
FIG. 8 is a block diagram for more concretely showing a current detector of the dynamic burn-in test equipment according to the embodiment of the present invention and peripheral circuits thereof.

FIG. 8 is a block diagram showing a concrete configuration used when an abnormal current flowing in the higher level power supply line 31 or the lower level power supply line (ground line) 35 according to the present invention is detected to decide a failure. FIG. 8 is a diagram obtained by focusing on only one DUT 21. However, 30 to 500 or more DUTs may be actually used as a matter of course. As shown in FIG. 8, in the embodiment of the present invention, the current detectors 11 has a current detecting resistor 91, and a differential amplifier 81 having an input connected to one end of the current detecting resistor 91 and another input connected to another end of the current detecting resistor 91. Similarly, the current detectors 15 has a current detecting resistor 92, and a differential amplifier 82 having an input connected to one end of the current detecting resistor 92 and another input connected to another end of the current detecting resistor 92. According to the configuration shown in FIG. 8, an abnormality of the internal circuit of the DUT 21 appears as changes in voltage of both the ends of the current detecting resistors 91 and 92. More specifically, voltages of both the ends of the current detecting resistors 91 and 92 amplified by the differential amplifiers 81 and 82 are output as voltages ΔVDD1 and ΔVSS1 to the output sides of the differential amplifiers 81 and 82. Therefore, when the voltages ΔVDD1 and ΔVSS1 are compared with an output voltage, or a threshold voltage $V_{th}$ from a threshold voltage power supply 73 by comparators 83 and 84, abnormal currents of the higher level power supply line 31 and the lower level power supply line (ground line) 35 are decided. More specifically, the logical "OR" between outputs from the comparators 83 and 84 is calculated by the OR gate 85, and the result may be stored in a decision result memory 75.

Depending on the specification of the DUT, the result may be stored in a disregard memory 76.

In FIG. 8, a predetermined input signal is applied from a pattern memory 61 to the input terminal of the DUT 21 through the driver 51, and a predetermined expected value is applied from the expectation memory 64 to the output terminal of the DUT 21 through a driver 55. When the internal circuit of the DUT 21 normally operates, an output signal from the DUT 21 and a signal given from the expectation memory 64 through the driver 55 are in an equilibrium state at the output terminal of the DUT 21. For this reason, a current does not flow.

(Modification of Current Detector)

Figure 9:
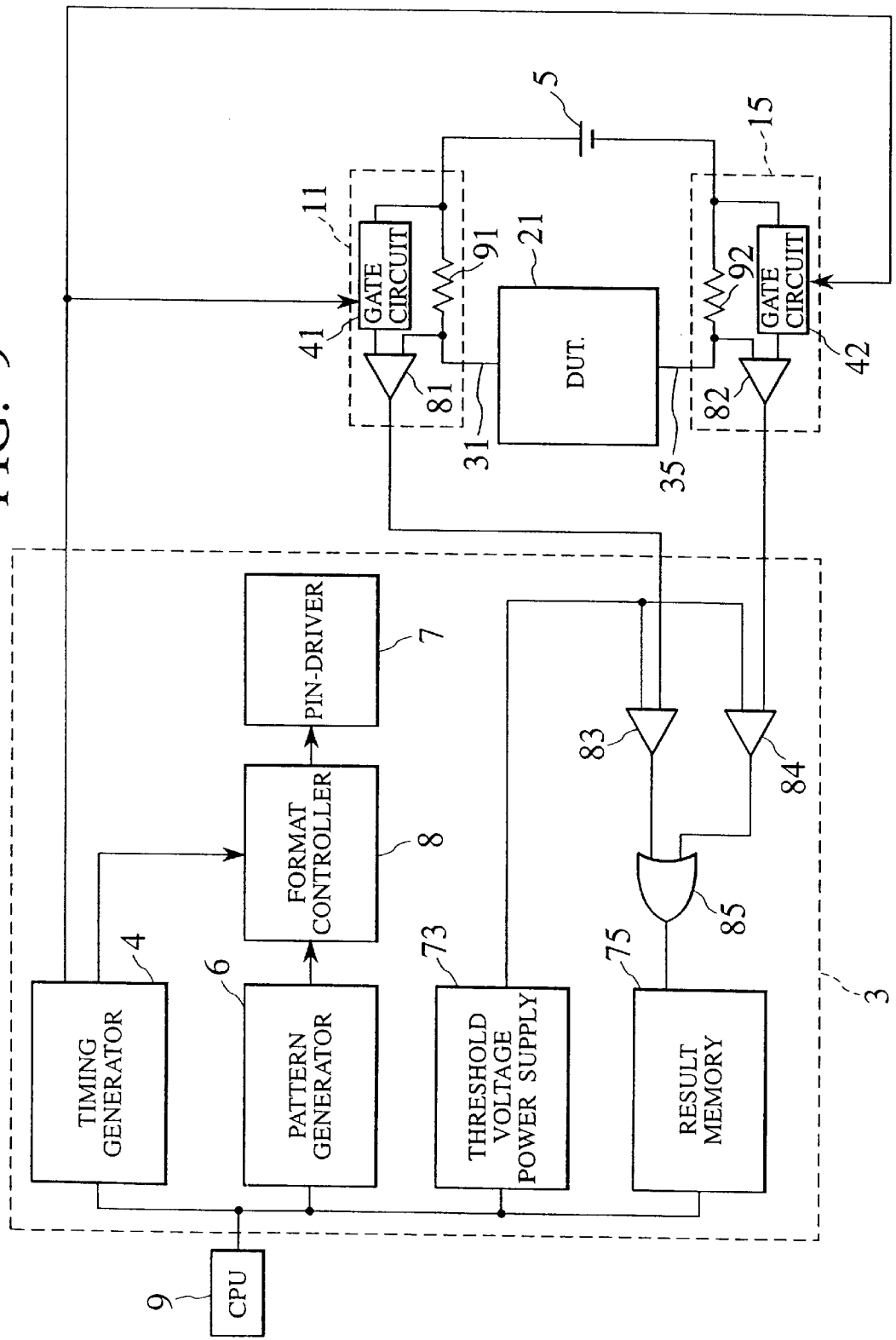
FIG. 9 is a block diagram a case in which gate circuits are added to the current detector of the dynamic burn-in test equipment according to a modification of the embodiment of the present invention.

The current detectors 11 and 15 according to the modification of above embodiment preferably comprise gate circuits 41 and 42 as shown in FIG. 9.

More concretely, the current detectors 11 has a current detecting resistor 91, a gate circuit 41 connected to one end of the current detecting resistor 91, and a differential amplifier 81 having an input connected to the gate circuit 41 and another input connected to another end of the current detecting resistor 91. Similarly, the current detectors 15 has a current detecting resistor 92, a gate circuit 42 connected to one end of the current detecting resistor 92, and a differential amplifier 82 having an input connected to the gate circuit 42 and another input connected to another end of the current detecting resistor 92. As is well known, in a CMOS logic circuit, a short-circuit transient current and a capacitive charge/discharge current flow when transition of the state of the internal circuit occurs. That is, no DC current should flow at timings other than a timing at which the state of the internal circuit of the CMOS logic circuit is inverted. However, if a failure occurs in the internal circuit for various reasons such as a defective gate oxide film of a MOS transistor constituting the internal circuit and a defective metal wire caused by electromigration, a power supply current IDD and a ground current ISS flow even at a timing between the state transition and the state transition. Therefore, when the gate circuits 41 and 42 are controlled by using an input signal given to the input terminal of the DUT and a signal from a timing generator 4 for controlling the format controller 8 used for shaping the waveform of the expected value signal given to the output terminal of the DUT, abnormalities of the currents IDD and ISS can be detected at a predetermined timing.

FIG. 10 is a timing chart showing the timings of the gate circuits 41 and 42 of the current detectors 11 and 15. There is a predetermined delay time Td between time given to the input terminal of the DUT by the input signal and time when an output voltage is generated by the output terminal. More specifically, when the pulse width between the input signal and the output signal is represented by T, the state of the internal circuit is in transition for a time represented by (Td+T). According to the present invention, as shown in FIG. 10, the gates of the current detectors are opened in periods other than a period in which the internal circuit is in transition to detects the currents IDD and ISS. For example, the gates may be opened at a timing immediately before the next state transition is started. As the simplest configuration, each of the gate circuit 41, 42 is constituted by one MOS transistor, and the MOS transistor may be switched by a voltage given to the gate electrode of the MOS transistor.

(Other Embodiments)

Various modifications will become possible for those skilled in the art after receiving the teaching of the present disclosure without departing from the scope thereof.

For example, as a current detector, a circuit configuration which uses a current detecting resistor to detect voltage drop between both the ends of the current detecting resistor has been described in FIG. 8 and FIG. 9. However, as the current detector, a circuit using a Hall element may be used as a matter of course.

Thus, the present invention of course includes various embodiments and modifications and the like which are not detailed above. Therefore, the scope of the present invention will be defined in the following claims.

What is claimed is:

1. A dynamic burn-in test equipment for detecting an abnormal operation of internal circuits merged in each of n devices under test, the each device has P input terminals and Q output terminals, the equipment comprising:

a thermostatic oven configured such that it can store n devices, wherein n represents a number variable having a value equal to the number of devices that can be tested at one time in the oven;

a driving unit configured such that it can apply P input signals to P input terminals in each of n devices and Q expected values to Q output terminals in each of n devices, wherein P and Q represent respectively, a number variable having a value equal to the number of input terminals and the number of output terminals of each device;

a power supply configured such that it can provide a power supply voltage to n devices through n higher level power supply lines and n lower level supply lines; and current detectors arranged on at least one of the higher and lower level power supply lines.

2. The equipment according to claim 1, wherein each of said current detector comprises:

a current detecting resistor inserted into one of the higher and lower level power supply lines; and a differential amplifier having an input connected to one end of the current detecting resistor and another input connected to another end of the current detecting resistor.

3. The equipment according to claim 1, wherein each of said current detector comprises:

a current detecting resistor inserted into one of the higher and lower level power supply lines;

a gate circuit connected to one end of the current detecting resistor; and a differential amplifier having an input connected to the gate circuit and another input connected to another end of the current detecting resistor.

4. The equipment according to claim 3, wherein said current detector measures a current in an interval between a timing at which transition of states of the internal circuit occurs and a timing at which next transition of the states of the internal circuit occurs.

5. The equipment according to claim 2, wherein said differential amplifier amplify a voltage drop between both ends of the current detecting resistor.

6. The equipment according to claim 3, wherein said differential amplifier amplify a voltage drop between both ends of the current detecting resistor.

7. The equipment according to claim 1, wherein said driving unit further comprises:

a pattern generator configured such that it generates expected value pattern;

a format controller connected to the pattern generator, configured such that it shapes wave form of the expected value pattern so as to form the expected values; and pin driver connected to the format controller, configured such that it supplies the expected values to each of said input terminals.

8. The equipment according to claim 7, wherein said pattern generator further comprises:

a expectation memory for storing the expected value; and a pattern memory for storing the input signals.

9. The equipment according to claim 2, wherein said driving unit further comprises:

a comparator having a input connected to the differential amplifier; and a threshold voltage power supply connected to another input of the comparator, for generating a threshold voltage to be compared with an output of the differential amplifier.

10. The equipment according to claim 3, wherein said driving unit further comprises:

a comparator having a input connected to the differential amplifier; and a threshold voltage power supply connected to another input of the comparator, for generating a threshold voltage to be compared with an output of the differential amplifier.

* * * * *